(12) United States Patent
McMenamy et al.

(10) Patent No.: US 7,961,060 B1
(45) Date of Patent: Jun. 14, 2011

(54) AMPLITUDE REGULATED RESONANT OSCILLATOR WITH SAMPLED FEEDBACK

(75) Inventors: Michael McMenamy, Tensed, ID (US);
Adam El-Mansouri, Moscow, ID (US);
Jonathon Stiff, Moscow, ID (US);
Mandonev Rajasekaran, Moscow, ID (US)

(73) Assignee: Cypress Semiconductor Corporation, San Jose, CA (US)

( * ) Notice: Subject to any disclaimer, the term of this patent is extended or adjusted under 35 U.S.C. 154(b) by 32 days.

(21) Appl. No.: 11/764,880

(22) Filed: Jun. 19, 2007

(51) Int. Cl.
*H03L 1/00* (2006.01)

(52) U.S. Cl. ............... 331/186; 331/158; 331/183

(58) Field of Classification Search ............... 331/108 R, 331/109, 116 R, 116 FE, 117 R, 117 FE, 331/117 D, 154, 156, 182, 183
See application file for complete search history.

(56) References Cited

U.S. PATENT DOCUMENTS

| | | | | |
|---|---|---|---|---|
| 5,457,433 A | * | 10/1995 | Westwick | 331/116 FE |
| 5,805,029 A | * | 9/1998 | Theus et al. | 331/116 FE |
| 5,959,505 A | * | 9/1999 | Ushiyama | 331/158 |
| 5,982,246 A | * | 11/1999 | Hofhine et al. | 331/116 FE |
| 6,057,735 A | * | 5/2000 | Cloutier | 330/279 |
| 6,559,730 B1 | * | 5/2003 | Marvin et al. | 331/158 |
| 6,628,175 B1 | * | 9/2003 | Guo et al. | 331/158 |
| 6,819,196 B2 | * | 11/2004 | Lovelace et al. | 331/183 |
| 7,061,338 B2 | * | 6/2006 | Arigliano | 331/109 |

* cited by examiner

*Primary Examiner* — James H. Cho
*Assistant Examiner* — Christopher Lo

(57) ABSTRACT

Disclosed is an oscillator circuit, comprising a crystal oscillator, an amplifier having an input and an output coupled across the crystal oscillator, a comparator having a reference input and an input coupled to the crystal oscillator and a pole network coupled between the comparator and the amplifier.

7 Claims, 5 Drawing Sheets

AMPLITUDE REGULATED RESONANT OSCILLATOR WITH SAMPLED FEEDBACK

TECHNICAL FIELD

The present invention relates generally to electronic circuits and in particular to oscillator circuits.

BACKGROUND

An electronic oscillator is an electronic circuit that produces a repetitive electronic signal, often a sine wave or a square wave. Electronic oscillators are widely used in many different electronic circuits, and virtually every device controlled by a computer or microcontroller uses an electronic oscillator.

A crystal oscillator is an electronic circuit that uses the mechanical resonance of a vibrating crystal of piezoelectric material to create an electrical signal with a very precise frequency. This frequency is commonly used to keep track of time (as in quartz wristwatches), to provide a stable clock signal for digital integrated circuits, and to stabilize frequencies for radio transmitters. Using an amplifier and feedback, it is an especially accurate form of an electronic oscillator. The crystal used therein is sometimes called a "timing crystal".

A first conventional crystal oscillator circuit 100 is shown in FIG. 1. The first conventional oscillator circuit 100 comprises a crystal 110, a variable-gain amplifier 120 having an input 122 coupled to a first side 112 of the crystal 110 and having an output 124 coupled to a second side 114 of crystal 110, and having a variable gain control 125. The circuit 100 further comprises a comparator 130 having a first input 132 coupled to the first side 112 of the crystal 110 and having an output 134 coupled to the variable gain control 125 of amplifier 120, a reference voltage 140 (Vref) is coupled to a second input 136 of comparator 130.

The function of circuit 100 is to regulate the size of a voltage signal across the crystal 110. If the voltage signal gets too large, unwanted harmonic content will result, and the excessive amplitude may degrade the lifetime of the crystal The comparator 130 comprises a peak detect function capable of detecting a positive or a negative peak value, a buffer function to buffer the positive or the negative peak value, and a compute function to determine the difference between the positive or negative peak value and the reference voltage 140. The reference voltage 140 provides a reference against which a voltage on the first side 112 of the crystal is compared to determine if the oscillation amplitude voltage produced by the crystal corresponds with the reference voltage 140.

The circuit 100 operates in the following manner. The oscillation amplitude voltage of crystal 110 is detected by comparator 130, compared with reference voltage 140, and the gain 125 of amplifier 120 is adjusted to bring the two voltages to parity. The comparator 130 and amplifier 120 together form an amplitude control network which multiplies the error between the signal amplitude from crystal 110 and the voltage reference 140 by a gain factor 125 via the amplifier 120. The output of amplifier 120 is filtered using a passive network to produce the control characteristic dominant pole and then applied to the amplifier gain.

A second conventional crystal oscillator circuit 200 is shown in FIG. 2. The circuit 200 comprises a crystal 210 having a first side 212 and a second side 214. First side 212 (node Xin) is coupled through first capacitor 216 to ground. Second side 214 (node Xout) which is coupled through second capacitor 218 to ground.

Circuit 200 further comprises an amplifier 220 having an input 222 coupled to node Xin 212, and an output 224 coupled to node Xout 218. Amplifier 220 further comprises a gain control input 225. Amplitude detector 230 has an input 232 coupled to input 222 of amplifier 220. Output 224 of amplifier 220 is coupled through a first resistor 260 to input 232 of the amplitude detector. Amplitude detector 230 produces an output 234 which is coupled to error amplifier 250.

Circuit 200 further comprises an error amplifier 250 having a first input 252 coupled to output 234 of amplitude detector 230. Voltage reference (Vref) 240 is coupled to input 256 of error amplifier 250. Output 254 of error amplifier 250 is coupled through second resistor 270 to a first side 282 of third capacitor 280, which has a second side 284 coupled to ground. The resistor 270 and third capacitor 280 form a low pass filter. First side 282 of capacitor 280 is coupled by a feedback loop to input 225 of the amplifier 220.

FIG. 2 operates in the following manner. Within the amplitude detect 230, only the peak-to-average signal magnitude is used to produce a signal proportional to oscillation amplitude. The average voltage changes with changing amplifier gain 225 producing positive feedback, therefore the error amplifier 230 contains a replica circuit to cancel this positive feedback in order to avoid instability. This technique generally does not work for error amplifier gains in excess of approximately 1.

Disadvantages of the conventional solution include that high power consumption and significant die area are required to achieve a high spectral purity signal. Furthermore, the conventional circuit 100 continuously couples noise from the reference signal onto the oscillator 110, resulting in phase noise on the oscillator output. While it is undesirable to produce excessive oscillation magnitude, regulating the crystal oscillation may produce undesirable phase noise, or an large investment in power and area devoted to noise reduction.

It would be desirable to have an oscillator controller with lower phase noise, lower power consumption and lower area use and where the magnitude of oscillations across the oscillator can be controlled.

DETAILED DESCRIPTION

An embodiment is described of an improved amplitude regulated resonant oscillator with sampled feedback. The improved oscillator applies peak-to-peak detection, blocking amplifier bias changes, thus enabling error amplifier gains of 10 or more to be realized. The improved solution provides both positive and negative peak detect capability, In the improved oscillator, a sampling network is used in a regulated resonant amplifier control loop. The sampling network operates by isolating the oscillator from transistor noise for the majority of its operating cycle, this limiting the introduction of transistor noise into the oscillator. The sampling network may be controlled by a state machine or other programmable control methods including but not limited to programmable logic, a microprocessor, a microcontroller, a logic core, firmware, software or other control mechanism.

The improved oscillator and sampling network may be used in resonator or oscillator applications and in systems comprising resonators or oscillators. Examples of these systems include but are not limited to a surface acoustic wave oscillator, a micro electronic mechanical system (MEMS) oscillator, a tank circuit oscillator, and a system for driving a crystal oscillator.

Figure 1:
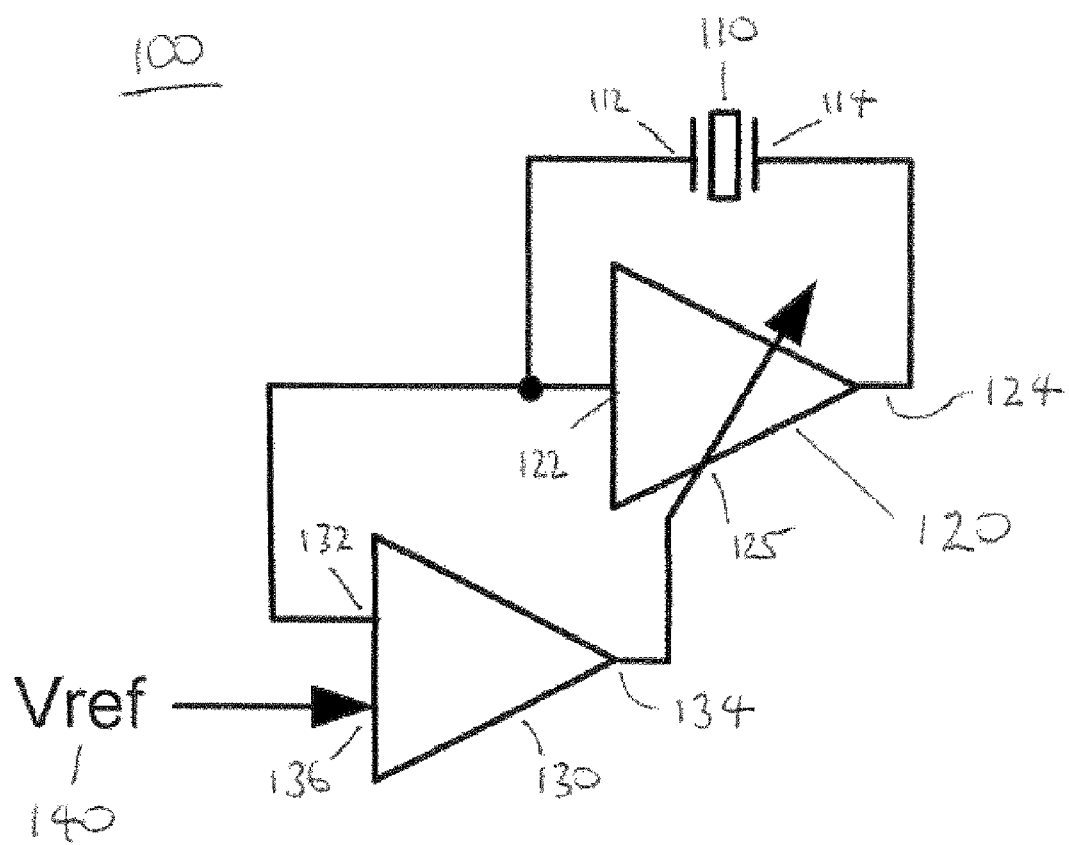
FIG. 1 illustrates a first conventional oscillator control solution.
Figure 2:
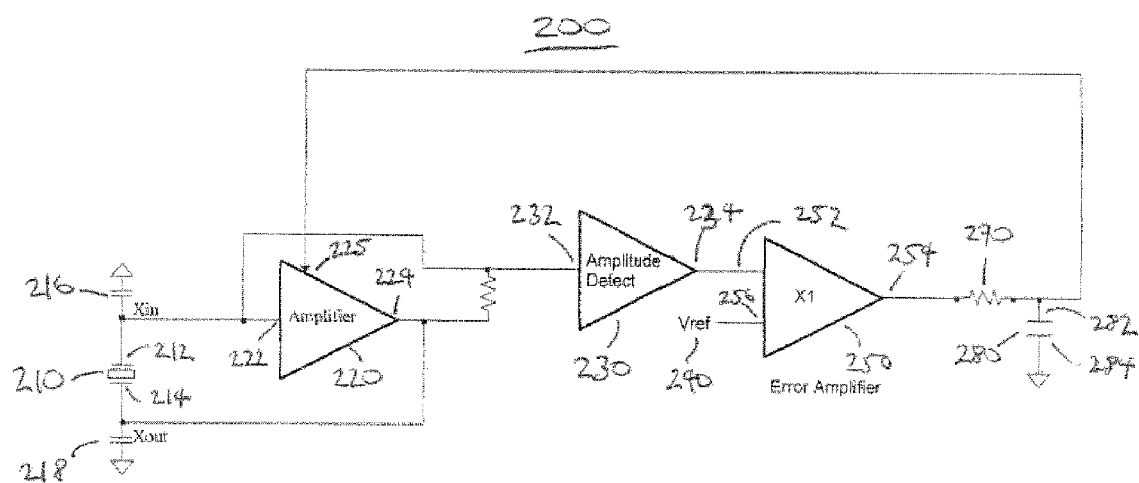
FIG. 2 illustrates a second conventional oscillator control solution.
Figure 3:
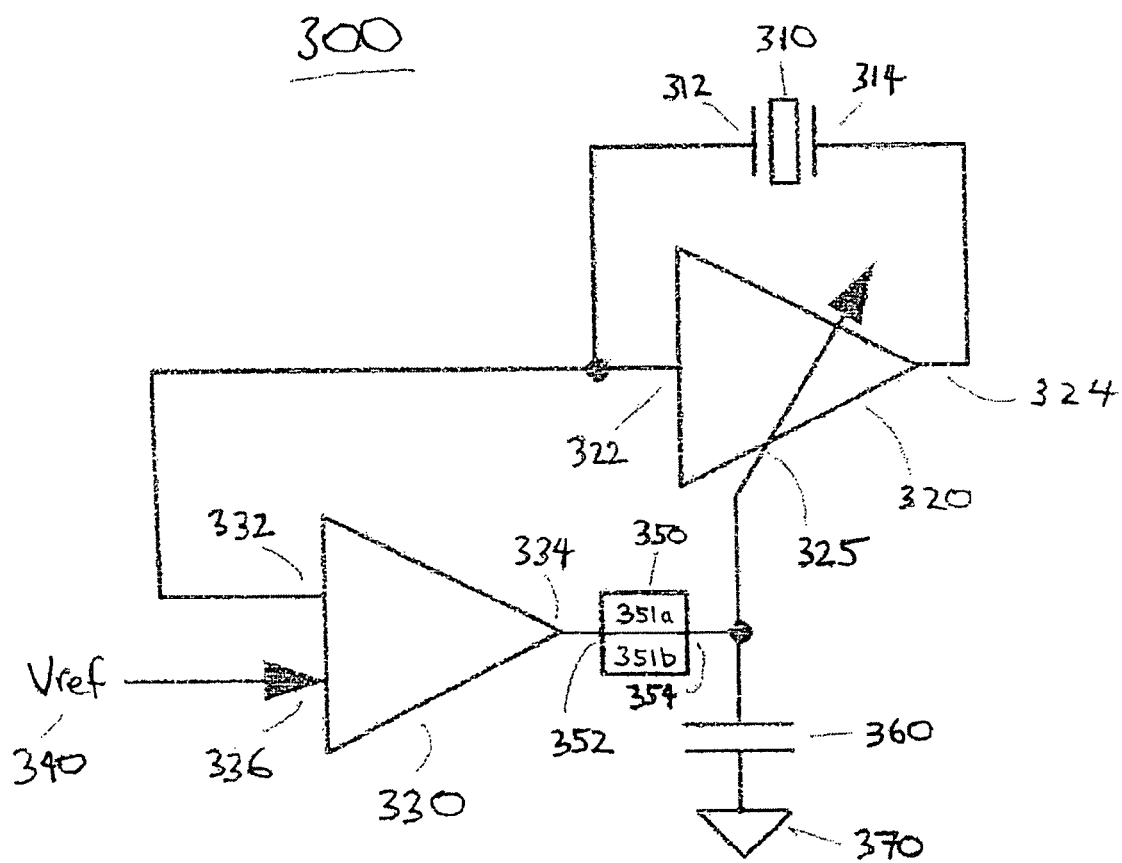
FIG. 3 illustrates a first improved sampling oscillator control solution having reduced noise.

FIG. 3 comprises an improved amplitude regulated resonant oscillator circuit 300. The circuit 300 comprises a crystal oscillator 310 having a first side 312 and a second slide 314. The circuit 300 further comprises a variable gain amplifier 320 having an input 322 and an output 324, and a gain input 325. The output 324 of amplifier 320 is coupled to second side 314 of crystal 310. The circuit 300 further comprises a comparator 330 having a first input 332, a second input 336 and an output 334. First input 332 of comparator 330 is coupled to first side 312 of crystal 310, and to input 322 of amplifier 320. The circuit 300 further comprises a switch 350 having an input 352 coupled to output 334 of comparator 330, and an output 354. A voltage reference signal 'Vref' 340 is coupled to second input 336 of comparator 330. The circuit 300 further comprises a capacitor 360 in series between output 354 of switch 350, and between ground potential 370. Output 354 of switch 350 is coupled to gain input 325 of amplifier 320. Switch 350 may comprise a pair of field effect transistors (FETs, e.g., FETs 351a and 351b), designed to short circuit nodes 335 and 354 together, or to open circuit node 334 from 354, leaving the stored voltage on capacitor 360 to bias the amplifier 320. The combination of switch 350 and capacitor 360 may be implemented with different topologies including but not limited to an operational amplifier (opamp) integrator or a switched capacitor network. In the circuit of FIG. 3 the dominant control loop pole produced by resistor 270 and capacitor 280 is generated using a sampling delay produced by switch 350 and capacitor 360.

Figure 4:
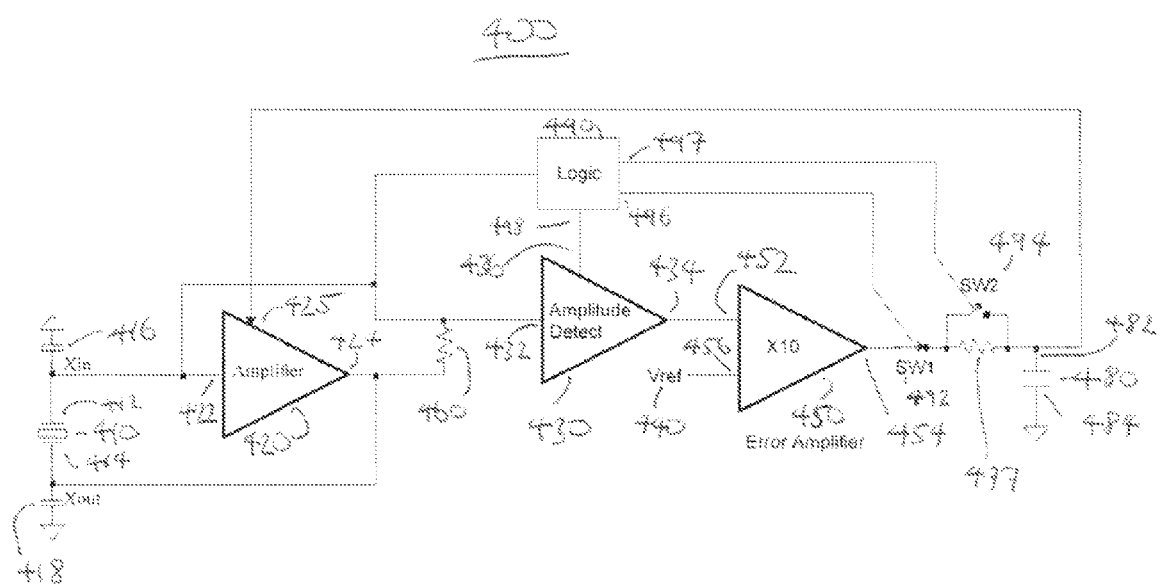
FIG. 4 illustrates a second improved sampling oscillator control solution having reduced noise.

FIG. 4 shows a circuit 400 for an improved sampling oscillator control solution having reduced noise. The circuit 400 comprises a crystal 410 having a first side 412 and a second side 414. First side 412 (node Xin) is coupled through first capacitor 416 to ground. Second side 414 (node Xout) is coupled through second capacitor 418 to ground.

Circuit 400 further comprises an amplifier 420 having an input 422 coupled to node Xin 412, and an output 424 coupled to node Xout 418. Amplifier 420 further comprises a gain control input 425. Amplitude detector 430 has an input 432 coupled to input 422 of amplifier 420. Output 424 of amplifier 420 is coupled through a first resistor 460 to input 432 of the amplitude detector. Amplitude detector 430 has an output 434 which is coupled to logic section 490 input 495.

Circuit 400 further comprises an error amplifier 450 having a first input 452 coupled to output 434 of amplitude detector 430. Voltage reference (Vref) 440 is coupled to input 456 of error amplifier 450. Output 454 of error amplifier 250 is coupled to a first switch 492 controlled by output 496 of logic block 490 and coupled to resistor 477 and to second switch 494 which bypasses resistor 470 when closed. Second switch 494 is controlled by output 497 of logic block 490.

Second switch 494 and resistor 470 are coupled to a first side 482 of capacitor 480 and in a feedback loop to gain input 425 of amplifier 420. Second side 484 of capacitor 480 is coupled to ground.

FIG. 4 operates in the following manner. During startup operation, switch 492 is closed and switch 494 is open, and the dominant pole of the control system is produced by resistor 470 and capacitor 480. After steady state is reached, a logic signal is generated in the amplitude detector, this signal at output 431 is coupled to logic system input 495, causing the logic block to enter sampling mode operation. In sampling mode, switch 494 is open, and switch 492 opens and closes periodically. Switch 492 is closed briefly to refresh the bias potential stored on capacitor 480 periodically. This sampling operation produces the dominant pole in the improved system. In the switch network, the switches are run by the logic block 490, and the strobe width and sampling period may be programmable, and derive from a state machine.

The connection between logic 490 and amplitude detector 436 forms a logic signal from the amplitude detector 436 which tells the logic section that oscillations have grown to significant amplitude. This instructs the logic block (in one embodiment using a state machine) sequencing through a startup mode and eventually into sampled feedback operation.

In a preferred embodiment, the pole network may be located away from noisy elements of the circuit to reduce the effect of noise on the pole stability.

In the improved solution, the maximum theoretical noise reduction is $20\log_{10}(T_{on}/T_{off})$. In one embodiment this is implemented with one oscillation cycle on, 4096 oscillations off, for 72 dB of maximum theoretical noise improvement. In other embodiments, different values may be used, and external sources may be used to determine both sample strobe width and sampling frequency, while remaining within the scope of this patent.

The state machine in FIG. 400 has strobe width selectable from 1 to 8 oscillator clock periods, and sampling frequency is selectable between 1024 and 4096 clock periods. The range of selectable values is limited only by system stability criterion and noise reduction requirements.

Figure 5:
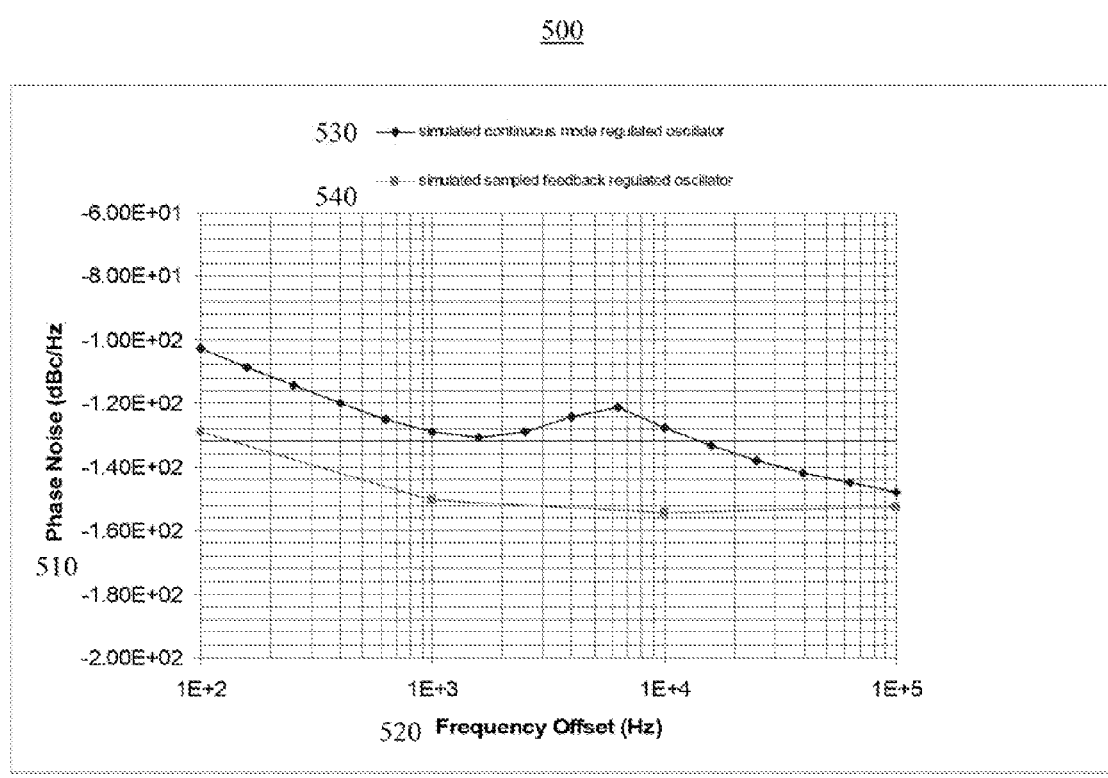
FIG. 5 illustrates a simulated comparison of sampled mode oscillator phase noise versus continuous mode oscillator phase noise.

FIG. 5 shows a chart 500 with a simulated comparison of sampled mode oscillator phase noise 540 versus continuous mode oscillator phase noise 530. The X axis 520 shows frequency offset in Hertz (Hz) and the Y axis 510 shows phase noise in dBc/Hz. The phase noise simulation 500 of FIG. 5 shows that in one embodiment significant noise reduction is realized through the application of sampled feedback in the oscillator.

In a first alternate embodiment, a Miller multiplied capacitor could be used instead of a resistor-capacitor pole network. In a second alternate embodiment, the resistor capacitor pole network could be implemented directly in the amplitude regulation circuits.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of this invention and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furtheimore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An oscillator circuit, comprising:
   a crystal oscillator;
   a variable gain amplifier having an input and an output, wherein the input is coupled to a first terminal of the crystal oscillator and the output is coupled to a second terminal of the crystal oscillator;
   a comparator having a reference input and an input coupled to the crystal oscillator; and
   a pole network coupled between an output of the comparator and an input of the amplifier, wherein the pole network comprises a periodically switched capacitance.

2. The circuit of claim 1, wherein the variable gain amplifier comprises a variable gain input.

3. The circuit of claim 2, wherein the switched capacitance comprises a switch and a capacitor, and wherein an input of the switch is coupled to an output of the comparator.

4. The circuit of claim 3, wherein the switch comprises a pair of field effect transistors (FETs).

5. The circuit of claim 3, wherein the capacitor is configured so a charge stored on the capacitor biases the variable gain input.

6. The circuit of claim 5, wherein the switch is configurable to close and sample an output voltage from the comparator and configurable to open and store the output voltage on the capacitor.

7. The circuit of claim 2, where the pole network comprises an operation amplifier integrator circuit.

* * * * *